United States Patent [19]
Tseng

[11] Patent Number: 6,090,700
[45] Date of Patent: *Jul. 18, 2000

[54] METALLIZATION METHOD FOR FORMING INTERCONNECTS IN AN INTEGRATED CIRCUIT

[75] Inventor: Horng-Huei Tseng, Hsinchu, Taiwan

[73] Assignee: Vanguard International Semiconductor Corporation, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/616,257

[22] Filed: Mar. 15, 1996

[51] Int. Cl.[7] ................................................. H01L 21/4763
[52] U.S. Cl. ........................... 438/624; 438/634; 438/637
[58] Field of Search ..................................... 438/624, 631, 438/637, 700, 720, 634

[56] References Cited

U.S. PATENT DOCUMENTS

| Re. 34,583 | 4/1994 | Grief et al. . |
|---|---|---|
| 4,879,257 | 11/1989 | Patrick . |
| 5,210,053 | 5/1993 | Yamagata . |
| 5,286,675 | 2/1994 | Chen et al. . |
| 5,591,673 | 1/1997 | Chao et al. . |

FOREIGN PATENT DOCUMENTS 8-37234  2/1996  Japan .

OTHER PUBLICATIONS

Silicon Processing for the VLSI Era, vol. 1: Process Technology, Stanley Wolf Ph.D., Richard N. Tauber Ph.D., Lattice Press, 1986, pp. 365–374.

*Primary Examiner*—Caridad Everhart
*Attorney, Agent, or Firm*—Christensen O'Connor Johnson & Kindness PLLC

[57] ABSTRACT

A metallization method for forming contact studs and via plugs is disclosed. The method includes: patterning first conductive contacts over a substrate; forming a first dielectric layer over the first conductive contacts and the substrate; forming a sacrificial layer on the first dielectric layer; forming openings through portions of the sacrificial layer and the first dielectric layer until the first conductive contacts are exposed; filling the openings with a second conductive layer; etching back the second conductive layer until the surfaces of the second conductive layer in the openings are near the interface of the sacrificial layer and the first dielectric layer; and removing the sacrificial layer. A metallization method for a multi-level conductive system is also disclosed.

30 Claims, 5 Drawing Sheets

METALLIZATION METHOD FOR FORMING INTERCONNECTS IN AN INTEGRATED CIRCUIT

BACKGROUND OF THE INVENTION

1. Field of the Invention

The present invention relates to a metallization method for forming interconnects such as contact studs in an integrated circuit, and also relates to a metallization method for forming via plugs in a multi-level metal system.

2. Description of the Prior Art

Surface metallization is critical to the operation of a semiconductor device. Surface metallization refers to the formation of the contact point from the outside world to the integrated circuitry. These contact points are formed directly on the integrated circuit device. As the chip density increases and the function of the device becomes more complicated, it is well known that a multi-level metal (MLM) system is required to provide adequate interconnection routings in an integrated circuit.

Tungsten and aluminum are two metals commonly used to form a contact stud in the first level of a MLM system or a via plug in or above the second level of a MLM system. The deposition of the metal to fill the contact hole that contains a contact stud or the via opening that contains a via plug in the prior art usually results in a center-line seam 1. This is caused by the columnar morphology of the metal layer 2 as shown in FIG. 1A. Another defect is known as the keyhole 3 defect. It is caused by premature coalescence of the metal layer 4 as shown in FIG. 1B. Furthermore, referring to FIG. 1C, even without those defects mentioned above, the contact stud 5 formed by etching back usually possesses a dimple. After etching, the resultant contact studs 1a, 4b, and 5 are not ideally formed, making the contact with an upper-level metal contact 6 difficult.

The defects mentioned above will increase the probability of a faulty connection between the metal levels. Also, the defects will decrease the current carrying capability of the contact stud or the via plug.

Furthermore, as the density of the integrated circuit increases, the contact studs and via plugs become smaller in size. This results in the aspect ratio of the contact studs and via plugs becoming quite large. Thus, it will become increasingly difficult to fabricate reliable interconnections in an integrated circuit.

Therefore, a need has arisen in the industry for an improved process which will overcome the above defects.

SUMMARY OF THE INVENTION

The present invention provides a metallization method for sub-micron high density integrated circuits. The method may be repeated to form interconnects in a multi-level metal (MLM) system. The present invention includes patterning first metal contacts over a substrate; forming a first dielectric layer on the first metal contacts and over the substrate; planarizing the surface of the first dielectric layer by chemical-mechanical polishing; forming a sacrificial layer on the first dielectric layer; forming openings by etching portions of the sacrificial layer and the first dielectric layer until the first metal contacts are exposed; filing the openings with a second metal layer; etching back the second metal layer until the surfaces of the second metal layer in the openings are near the interface of the sacrificial layer and the first dielectric layer; and removing the sacrificial layer. By repeating the steps described above, a multi-level metal system can be achieved.

DESCRIPTION OF THE PREFERRED EMBODIMENT

Figure 1A:
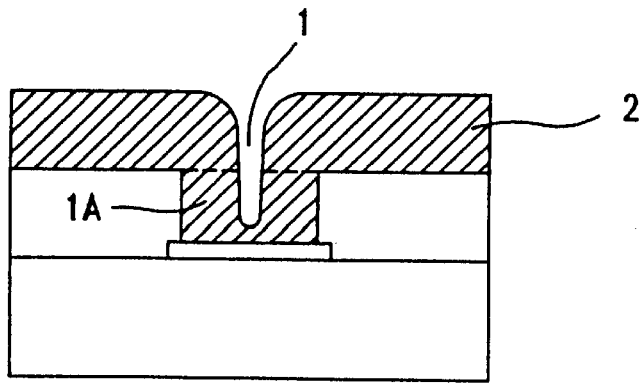
FIG. 1A illustrates schematically a cross-sectional view of a center-line seam defect in a contact stud in the prior art.
Figure 1B:
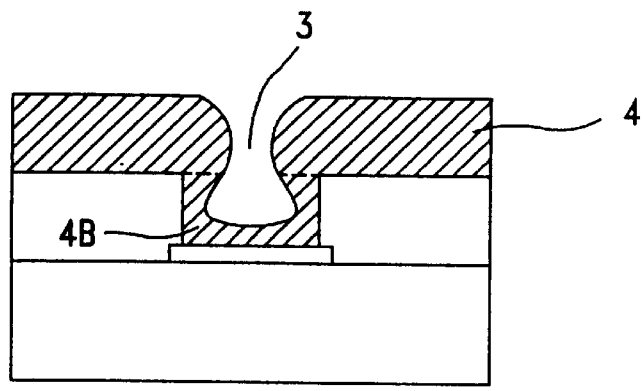
FIG. 1B illustrates schematically a cross-sectional view of a keyhole defect in a contact stud in the prior art.
Figure 1C:
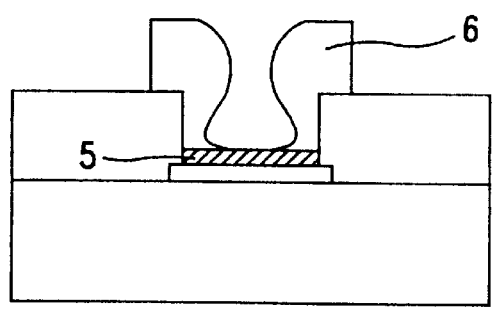
FIG. 1C illustrates schematically a cross-sectional view of a dimple defect in a contact stud in the prior art.
Figure 2:
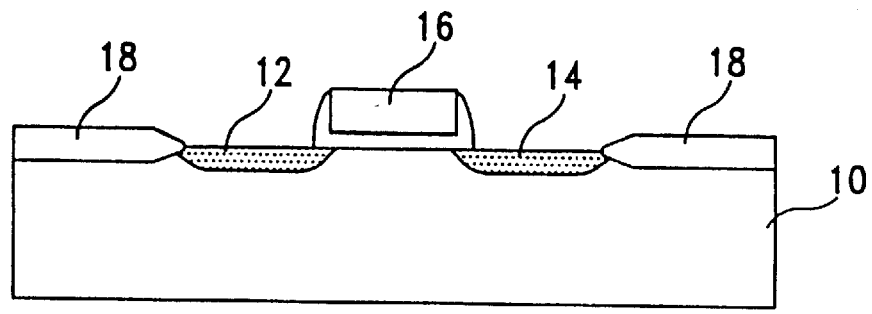
FIGS. 2–12 illustrate schematically, in cross section, the various steps used to form contact studs and via plugs for a metal-oxide-semiconductor (MOS) device.

FIG. 2 shows a schematic cross-section of a metal-oxide-semiconductor (MOS) transistor 11 fabricated in a semiconductor substrate 10, wherein a source region 12, a drain region 14 and a gate region 16 are formed in the substrate 10. The MOS device is further isolated by field oxides (FOX) 18 from other adjacent devices (not shown) in the same substrate 10.

Figure 3:
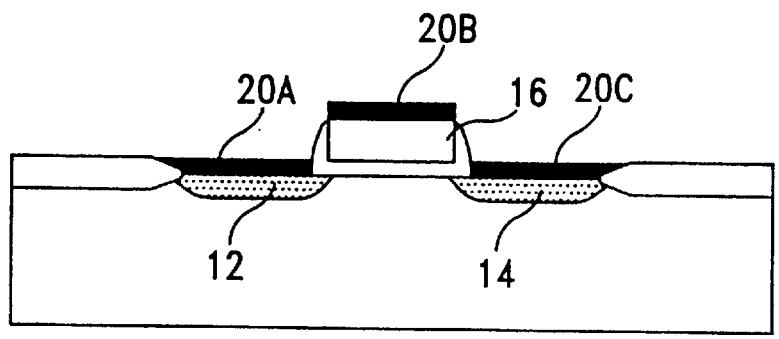

For interconnecting the transistor 11 to other semiconductor devices in the substrate 10 to form a desired circuit, low-resistance conductor contacts 20A, 20B and 20C must be formed and patterned as shown in FIG. 3. For source/drain depths larger than 1 $\mu$m and surface dopant concentration above $10^{20}$ cm$^{-3}$, aluminum is the most widely used material for forming the first metal contacts 20A, 20B and 20C. The first metal contacts 20A, 20B and 20C are formed preferably by depositing an aluminum film using a vacuum evaporation process with about $5 \times 10^{-5} \sim 1 \times 10^{-9}$ torr of pressure. Next, the aluminum film is covered with a photo-resist mask that exposes all areas of the integrated circuit except for first metal contacts 20A, 20B and 20C. Finally, the unmasked portions of the film are etched in, for example, a mixture of 73% H$_3$PO$_4$/4% HNO$_3$ at 30° C. to 80° C.

For source/drain depths below 0.5 $\mu$m and dopant concentration less than $10^{20}$ cm$^{-3}$ (commonly in modern high density technologies), aluminum is not suitable for making the first metal contacts 20A, 20B and 20C due to its spike effect that can cause high current leakage in source/drain regions 12 and 14. One alternative material is silicide, which is formed by reacting metal with silicon. The silicides WSi$_2$, TiSi$_2$ and CoSi$_2$ are commonly used for their low resistivities and stability. Accordingly the first metal contacts 20A, 20B and 20C in FIG. 3 can be formed by co-depositing the metal, for example Ti, with silicon by sputtering or chemical vapor deposition (CVD), followed by thermal annealing to homogenize the silicide to achieve a low resistance film. Then, a photo-resist mask and a reactive ion etching (RIE) step is used to pattern the silicide film to form the first metal contacts 20A, 20B and 20C on the source 12, the gate 16 and the drain 14 respectively.

Figure 4:
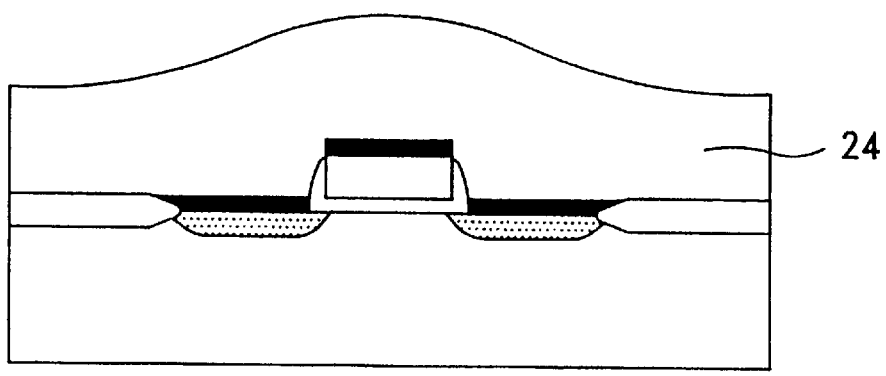

Referring to FIG. 4, a dielectric layer 24 having a thickness of about 3000~6000 Å is formed over the entire structure of FIG. 3. For example, the dielectric layer 24 may be a plasma enhanced chemical vapor deposition (PECVD) oxide film preferably formed by the reaction of silane (SiH$_4$) at about 350° C. with N$_2$O as shown below:

$$SiH_4 + 2\ N_2O \rightarrow SiO_2 + 2\ N_2 + 2\ H_2$$

Figure 5:
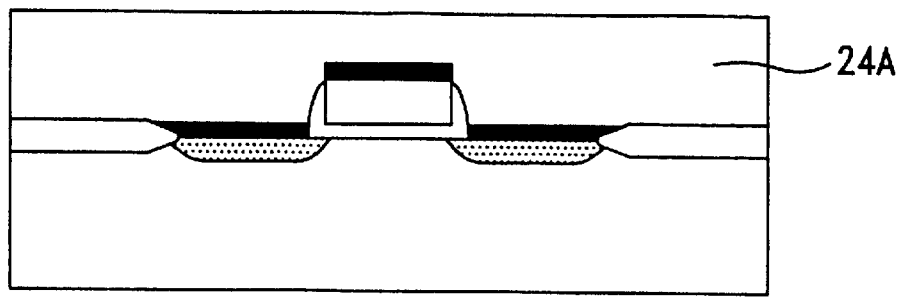

The dielectric layer 24 is then subjected to a planarization step to reduce non-uniformities at the surface. For example, a chemical-mechanical polishing (CMP) is commonly used with an alkali solution (pH≧10), resulting in the structure as shown in FIG. 5.

Figure 6:
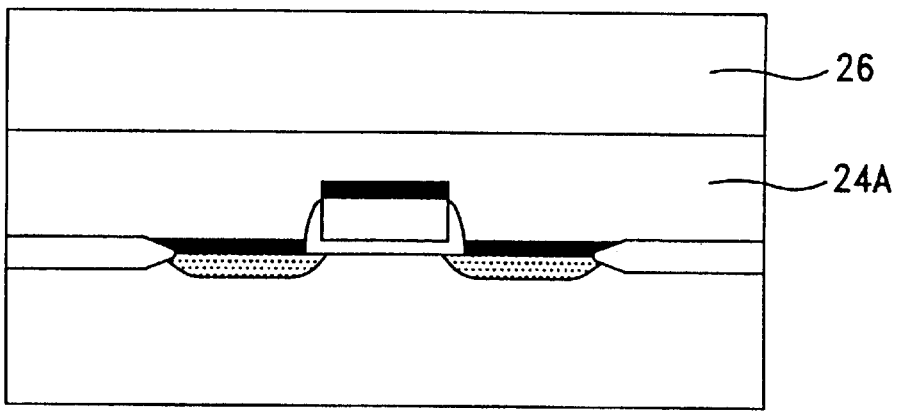

A sacrificial layer 26 as shown in FIG. 6, having a thickness of about 3000~6000 Å, is formed on the planarized dielectric layer 24. The sacrificial layer 26 is formed, for example, by baking a dpoed spin-on-glass (SOG) layer, resulting in a planarized silicon dioxide layer. The sacrificial layer 26 can be formed alternatively by depositing a plasma enhanced CVD (PECVD) silicon nitride layer from silane at about 300~400° C.

Figure 7:
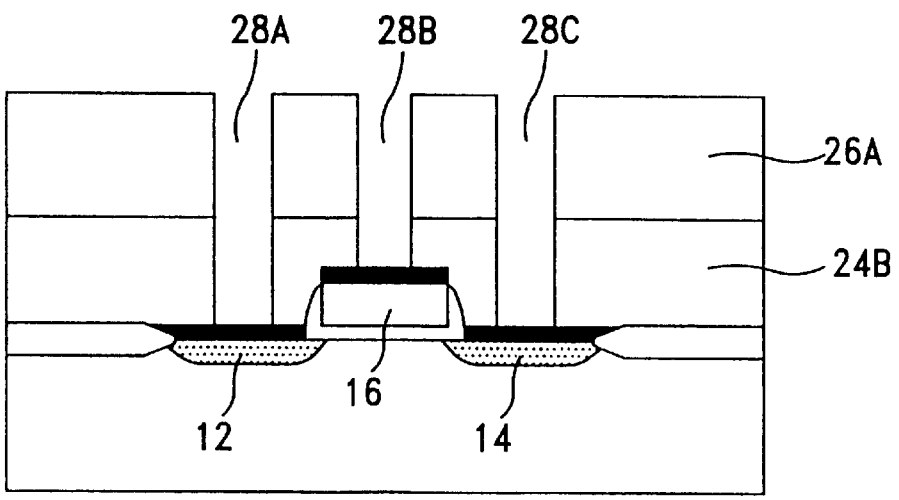

Turning next to FIG. 7, contact openings 28A, 28B and 28C are opened through portions of the sacrificial layer 26 and the dielectric layer 24 for the source 12, the gate 16 and the drain 14 by way of a plasma etching process.

Figure 8:
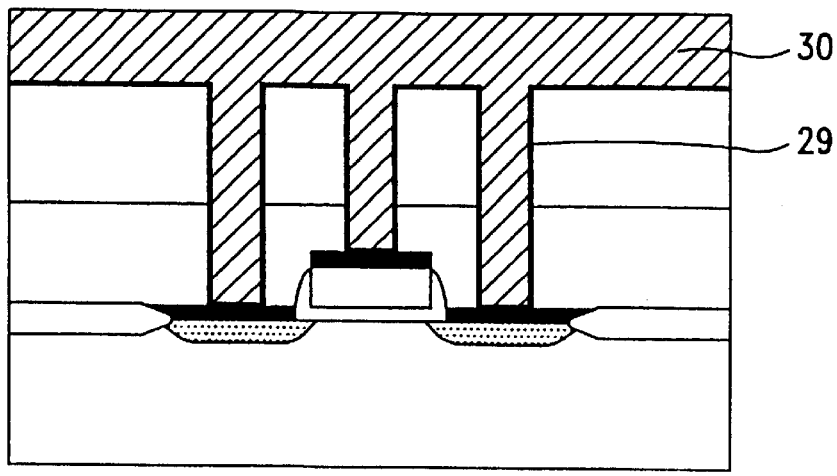

Referring to FIG. 8, metal is used to fill the openings 28A, 28B and 28C of FIG. 7. Tungsten CVD is commonly used for filling the openings 28A, 28B and 28C to form contact studs in the first level of a MLM system or via plugs in or above the second level for a MLM system.

The filling of the openings 28A, 28B and 28C is done with a metal fill 30. As can be seen, metal fill 30 suffers from the center line seam difficulty of the prior art. However, because of the increased depth resulting from sacrificial layer 26, the defects do not extend past the boundary of the sacrificial layer 26 and the dielectric layer 24. Thus, the use of the sacrificial layer eliminates the defects as will be seen in greater detail below. Further, if tungsten or aluminum is used, the contact openings 28A, 28B and 28C are typically deposited by sputtering a thin film 29 of Ti or Ti/TiN on the sidewalls and the bottoms of the openings 28A, 28B and 28C prior to filling the openings. The thin film 29 serves as a diffusion barrier and as a glue layer for tungsten adhesion or as a wetting film to enhance aluminum reflow.

In the case of a CVD tungsten material, the metal fill 30 is achieved by pyrolitic decomposition of tungsten hexafluoride ($WF_6$) at about 800° C. as shown below:

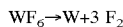
$WF_6 \rightarrow W + 3 F_2$ or by the reduction of $WF_6$ with hydrogen at about 250~600° C.:

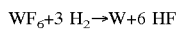
$WF_6 + 3 H_2 \rightarrow W + 6 HF$ or by the reduction of $WF_6$ with silicon at about 250~600° C.:

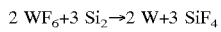
$2 WF_6 + 3 Si_2 \rightarrow 2 W + 3 SiF_4$ or by the reduction of $WF_6$ with silane at about 250~600° C.:

$2 WF_6 + 3 SiH_4 \rightarrow W + 3 SiF_4$

Alternatively, if metal fill 30 is CVD aluminum instead, it is done by thermal decomposition of tri-isobutyl aluminum (TIBA) above 220° C. as shown below:

$2 Al(C_4H_9)_3 \rightarrow 2 Al + 3 H_2 + 6 C_4H_8$

Figure 9:
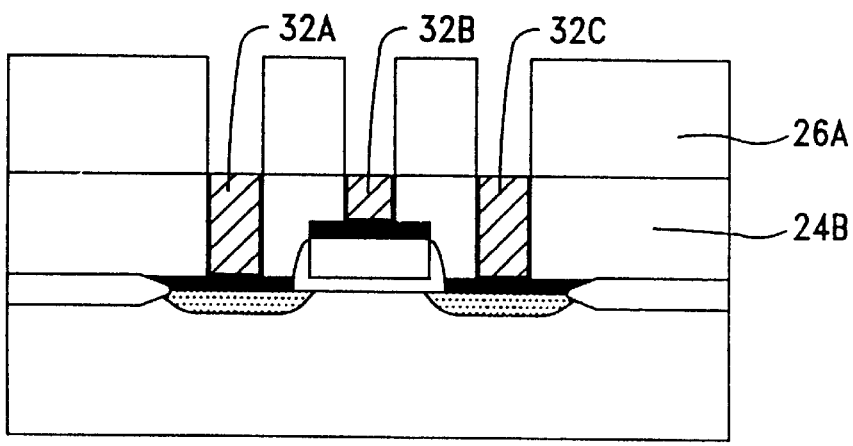

The metal fill 30 is then etched back by, for example, a plasma etching process until the top surfaces of the resultant contact studs 32A, 32B and 32C (FIG. 9) are near the interface between the sacrificial layer 26 and the dielectric layer 24.

Figure 10:
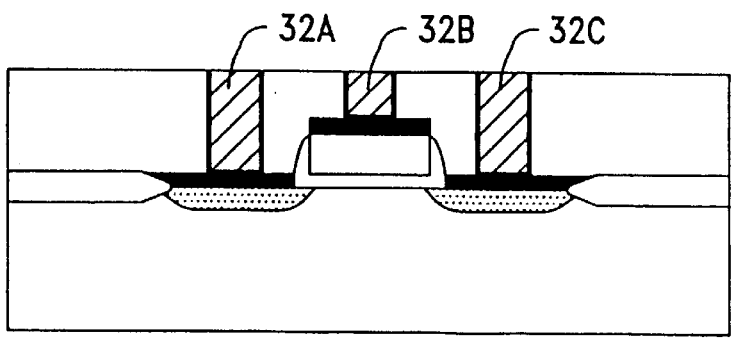

Next, the sacrificial layer 26 is removed by etching in a boiling phosphoric acid solution. FIG. 10 shows the structure after the sacrificial layer 26 is removed. By adding the sacrificial layer 26 of the present invention, contact studs 32A, 32B and 32C can be formed without the defects that plaque the prior art.

Figure 11:
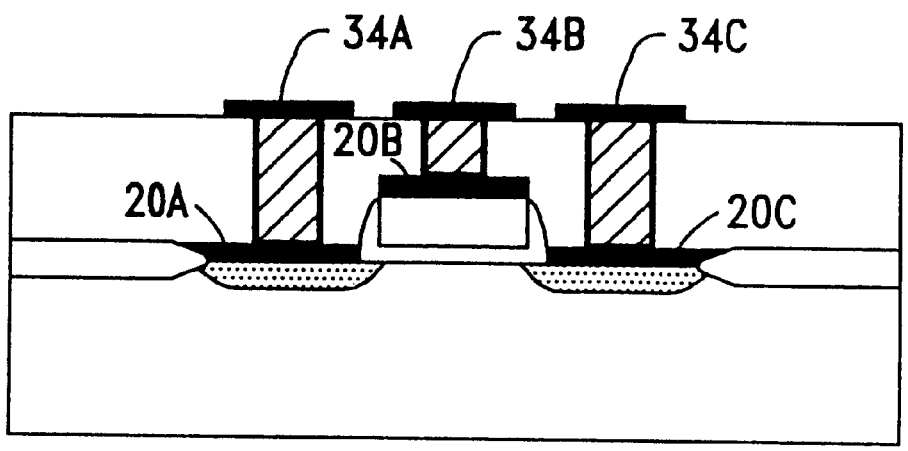
Figure 12:
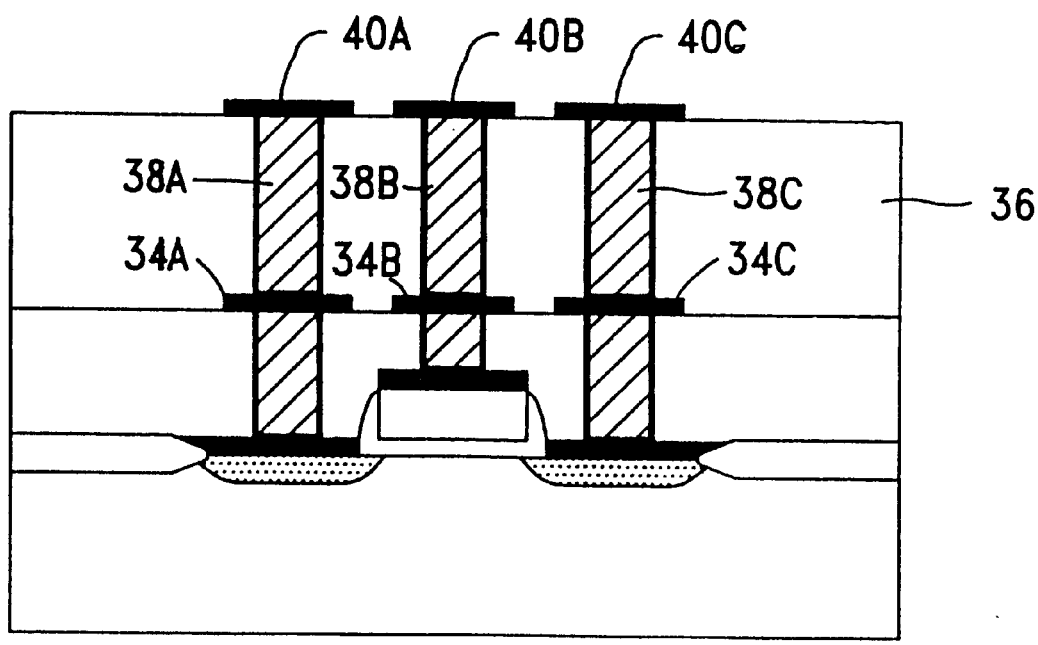

Continuing, the second metal contacts 34A, 34B and 34C shown in FIG. 11 can be formed by using the same process described above in connection with FIG. 3. By repeating the steps described earlier in connection with FIG. 4 through FIG. 11, a multi-level metal (MLM) system can be achieved. For example, after patterning second metal contacts 34A, 34B and 34C, another dielectric layer 36 (FIG. 12) can be PECVD deposited and planarized by CMP. Next, a sacrificial layer may be deposited, openings formed by etching, via plugs 38A, 38B and 38C formed, and third metal contacts 40A, 40B and 40C patterned as shown in FIG. 12.

The specific embodiment described above is illustrative of the principle of the invention and is not intended to limit the invention to the embodiment described. For example, dielectric layer and sacrificial layer different from those described may be used in other embodiments. Of course, layers of different thickness may be used in other embodiments. Accordingly, although specific embodiment has been illustrated and described, it will be obvious to those skilled in the art that various modification may be made without departing from the spirit and the scope of the invention, which is intended to be limited solely by the appended claims.

What is claimed is:

1. A method for forming interconnects in an integrated circuit, the method comprising:

patterning a plurality of first conductive contacts over a substrate;

forming a first dielectric layer over said first conductive contacts and said substrate;

forming a silicon nitride layer atop said first dielectric layer, said silicon nitride layer having a thickness of about 3500 to 6000 angstroms;

forming a plurality of openings through selected portions of said silicon nitride layer and said first dielectric layer such that said first conductive contacts are exposed;

filling said plurality of openings with a second conductive layer;

etching back the second conductive layer until the surfaces of the second conductive layer in the openings are near the boundary of said silicon nitride layer and said first dielectric layer; and removing said silicon nitride layer.

2. The method of claim 1, wherein the step of patterning the first conductive contacts comprises the steps of:

forming a first conductive layer over the substrate;

defining regions of the first conductive contacts by applying a photoresist mask on the first conductive layer; and removing unmasked portions of the first conductive layer.

3. The method of claim 1, further comprising planarizing the first dielectric layer.

4. The method of claim 1, wherein said plurality of openings are formed by plasma etching.

5. The method of claim 1, wherein said second conductive layer is a tungsten layer deposited by chemical vapor deposition.

6. The method of claim 1, further comprising the step of patterning a plurality of third conductive contacts on the surface of the etched second conductive layer.

7. The method of claim 1 further comprising the step of forming a thin layer of conductor on the sidewalls and bottoms of the plurality of openings.

8. The method of claim 7, wherein said thin layer is Ti deposited by sputtering.

9. The method of claim 7, wherein said thin layer is Ti/TiN deposited by sputtering.

10. The method of claim 1, wherein said first dielectric layer is a silicon dioxide layer deposited by plasma enhanced chemical vapor deposition.

11. The method of claim 1, wherein said silicon nitride layer is deposited by plasma enhanced chemical vapor deposition.

12. The method of claim 1, wherein the step of patterning the first conductive contacts comprises the step of:

co-depositing the first conductive layer with silicon over the substrate to form a silicide layer;

thermally annealing the silicide layer;

defining regions of the first conductive contacts by applying a photoresist mask over the silicide layer; and removing unmasked portions of the silicide layer.

13. The method of claim 1, wherein at least one of said first conductive contacts is formed on a gate electrode.

14. The method of claim 1, wherein at least one of said first conductive contacts is formed on a source electrode or a drain electrode.

15. A method for forming interconnects in an integrated circuit, the method comprising:

patterning a plurality of first conductive contacts on a first dielectric layer, which is over a substrate;

forming a second dielectric layer on the first conductive contacts and the first dielectric layer;

planarizing the second dielectric layer by chemical-mechanical polishing;

forming a silicon nitride layer on the second dielectric layer, said silicon nitride layer having a thickness of about 4000 to 6000 angstroms;

forming a plurality of openings by etching portions of the silicon nitride layer and the second dielectric layer until the first conductive contacts are exposed;

filling said openings with a conductive layer;

etching back the conductive layer until the surfaces of the conductive layer in the plurality of openings are near the interface of the silicon nitride layer and the second dielectric layer; and removing said silicon nitride layer.

16. The method of claim 15, wherein patterning the first conductive contacts comprises:

forming the conductive layer on the first dielectric layer;

defining regions of the first conductive contacts by applying a photo-resist mask on the first conductive layer; and removing unmasked portions of the conductive layer.

17. The method of claim 15, wherein said plurality of openings are formed by plasma etching.

18. The method of claim 15, wherin said conductive layer is a tungsten layer deposited by chemical vapor deposition.

19. The method of claim 15 further comprising the step of forming a thin layer of conductor on the sidewalls and bottoms of the openings.

20. The method of claim 15, wherein said second dielectric layer is a silicon dioxide layer deposited by plasma enhanced chemical vapor deposition.

21. The method of claim 15, wherein said silicon nitride layer is deposited by plasma enhanced chemical vapor deposition.

22. The method of claim 15, wherein patterning the first conductive contacts comprises:

co-depositing the conductive layer with silicon on the first dielectric layer to form a silicide layer;

thermally annealing the silicide layer;

defining regions of the first conductive contacts by applying a photo-resist mask on the silicide layer; and removing unmasked portions of the silicide layer.

23. A method for forming interconnects in an integrated circuit, the method comprising:

patterning a plurality of first conductive contacts over a substrate having thereon at least a source electrode, at least a gate electrode and at least a drain electrode;

forming a first dielectric layer on the first conductive contacts and over the substrate;

planarizing the first dielectric layer by chemical-mechanical polishing;

forming a silicon nitride layer on the first dielectric layer, said silicon nitride layer having a thickness of about 4000 to 6000 angstroms;

forming a plurality of openings by etching portions of the silicon nitride layer and the first dielectric layer until the first conductive contacts are exposed;

filling said openings with a second conductive layer;

etching back the second conductive layer until the surfaces of the second conductive layer in the openings are near the interface of the silicon nitride layer and the first dielectric layer whereon the silicon nitride layer is left intact; and removing said silicon nitride layer.

24. The method of claim 23, wherein patterning the first conductive contacts comprises:

forming the first conductive layer on the source electrode, the gate electrode, the drain electrode and portions of the substrate;

defining regions of the first conductive contacts by applying a photo-resist mask on the first conductive layer; and removing unmasked portions of the first conductive layer.

25. The method of claim 23, wherein said plurality of openings are formed by plasma etching.

26. The method of claim 23, wherein said second conductive layer is a tungsten layer deposited by chemical vapor deposition.

27. The method of claim 23 further comprising the step of forming a thin layer of conductor on the sidewalls and bottoms of the openings.

28. The method of claim 23, wherein said first dielectric layer is a silicon dioxide layer deposited by plasma enhanced chemical vapor deposition.

29. The method of claim 23, wherein said silicon nitride layer is deposited by plasma enhanced chemical vapor deposition.

30. The method of claim 23, wherein patterning the first conductive contacts comprises:

co-depositing the first conductive layer with silicon on the source electrode, the gate electrode, the drain electrode and portions of the substrate;

thermally annealing the silicide layer;

defining regions of the first conductive contacts by applying a photo-resist mask on the silicide layer; and removing unmasked portions of the silicide layer.

* * * * *